(12) United States Patent
Chen et al.

(10) Patent No.: US 10,371,457 B2
(45) Date of Patent: Aug. 6, 2019

(54) HEAT DISSIPATION DEVICE

(71) Applicant: AURAS Technology Co., Ltd., New Taipei (TW)

(72) Inventors: Hong-Long Chen, New Taipei (TW); Chun-Yi Lee, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 83 days.

(21) Appl. No.: 15/717,055

(22) Filed: Sep. 27, 2017

(65) Prior Publication Data

US 2019/0056180 A1 Feb. 21, 2019

(30) Foreign Application Priority Data

Aug. 18, 2017 (TW) .............................. 106128116 A

(51) Int. Cl.
*F28D 15/04* (2006.01)
*F28F 1/24* (2006.01)
*F28F 1/14* (2006.01)

(52) U.S. Cl.
CPC ................ *F28D 15/04* (2013.01); *F28F 1/24* (2013.01); *F28F 1/14* (2013.01)

(58) Field of Classification Search
CPC ................ F28D 15/04; F28F 1/14; F28F 1/24

USPC ..................... 165/80.3, 80.4, 104.26, 104.33
See application file for complete search history.

(56) References Cited

U.S. PATENT DOCUMENTS

| | | | | |
|---|---|---|---|---|
| 7,277,287 | B2* | 10/2007 | Chen ................... | H01L 23/4006 165/104.33 |
| 2008/0314556 | A1* | 12/2008 | Zhou ................... | F28D 15/0266 165/80.3 |
| 2012/0050983 | A1* | 3/2012 | Chen ................... | F28D 15/0233 361/679.47 |

* cited by examiner

*Primary Examiner* — Joel Attey
(74) *Attorney, Agent, or Firm* — WPAT, PC

(57) ABSTRACT

A heat dissipation device includes a first fin group, a second fin group, a heat pipe and a base. The base is in thermal contact with a heat source. The heat pipe includes a first pipe part and a second pipe part. The second pipe part is connected with the first pipe part and extended upwardly. The first pipe part is arranged between the base and the second fin group. The second pipe part is penetrated through the first fin group. The distance between a top surface of the first fin group and the base is larger than the distance between a top surface of the second fin group and the base. Since influences of the dissipating area and the wind resistance are taken into consideration, the heat dissipation device has enhanced heat dissipating efficacy.

13 Claims, 8 Drawing Sheets

HEAT DISSIPATION DEVICE

FIELD OF THE INVENTION

The present invention relates to a heat dissipation device, and more particularly to a heat dissipation device with fins.

BACKGROUND OF THE INVENTION

With increasing development of computers and various electronic devices, people in the modern societies are used to using the computers and the electronic devices for a long time. During operations of the computers and the electronic devices, a great deal of heat is generated. If the heat cannot be effectively dissipated away, some drawbacks occur.

For solving the above drawbacks, a heat dissipation device with fins has been introduced into the market. FIG. 1 is a schematic perspective view illustrating a conventional heat dissipation device. The heat dissipation device 1 comprises plural heat pipes 10, a fin group 11 and a base 12. The base 12 is in thermal contact with a heat source (not shown). The fin group 11 comprises plural fins 111. These fins 111 are arranged side by side and nearly parallel with each other along a vertical direction D1. Each heat pipe 10 comprises a first pipe part 101, a second pipe part 102 and a third pipe part 103. The second pipe part 102 is connected with a first side of the first pipe part 101 and bent and extended upwardly. The third pipe part 103 is connected with a second side of the first pipe part 101 and bent and extended upwardly. The first pipe part 101 of each heat pipe 10 is disposed on the base 12 or penetrated through the base 12. The second pipe part 102 of each heat pipe 10 is penetrated upwardly through first sides of all fins 111 of the fin group 11. The third pipe part 103 of each heat pipe 10 is penetrated upwardly through second sides of all fins 111 of the fin group 11.

The operations of the heat dissipation device 1 will be described as follows. FIG. 2 is a schematic side view illustrating the cooperation of the heat dissipation device of FIG. 1 and a fan. Firstly, the heat generated by the heat source is transferred to the base 12. Then, the heat is transferred to the first pipe part 101 of the each heat pipe 10 through the base 12. After the heat is received by the first pipe part 101 of the each heat pipe 10, the heat is transferred to the second pipe part 102 and the third pipe part 103 at bilateral sides of the first pipe part 101. Afterwards, the heat is transferred to the fin group 11 and the neighboring sites. The fan 2 is located near and beside the heat dissipation device 1. The fan 2 is used for driving the airflow P1 to pass through the fin group 11. Consequently, the heat accumulated in the fin group 11 and near the fin group 11 is dissipated away by the airflow P1. The operating principles of the heat pipe 10 are well known to those skilled in the art, and are not redundantly described herein.

For increasing the heat dissipating performance, the space of the heat dissipation device 1 is fully utilized to install the fins 111 to increase the heat dissipating area. Consequently, the heat dissipation device 1 usually has a tower shape as shown in FIGS. 1 and 2. That is, the heat dissipation device 1 is so-called tower-type heat sink. However, in case that the heat dissipation device 1 is applied to a large-sized electronic device or system (e.g., a cloud service system), the fan 2 is not always located near the heat dissipation device 1. If the airflow P1 produced by the fan 2 comes from a remote position to the heat dissipation device 1, the tower structure of the heat dissipation device 1 results in a high wind resistance. Due to the high wind resistance, it is difficult for the airflow P to pass through the heat dissipation device 1. Consequently, the heat dissipating efficacy is usually unsatisfied.

According to the above discussions, both of the heat dissipating area and the wind resistance should be taken into consideration when the heat dissipation device is designed.

SUMMARY OF THE INVENTION

For solving the drawbacks of the conventional technologies, the present invention provides a heat dissipation device with satisfied heat dissipating efficacy when the heat dissipating area and the wind resistance are taken into consideration.

In accordance with an aspect of the present invention, there is provided a heat dissipation device. The heat dissipation device includes a first fin group, a base, a heat pipe and a second fin group. The base is in contact with a heat source. The heat pipe includes a first pipe part and a second pipe part. The second pipe part is connected with a first side of the first pipe part and bent and extended upwardly, the first pipe part is installed on the base. The second pipe part is penetrated through the first fin group. The second fin group is located over the first fin group. The maximum vertical distance between a top surface of the first fin group and the base is larger than the maximum vertical distance between a top surface of the second fin group and the base.

In an embodiment, the maximum vertical distance between a bottom surface of the first fin group and the base is larger than the maximum vertical distance between a bottom surface of the second fin group and the base.

In an embodiment, the first fin group includes plural first fins, and the plural first fins are arranged along a first arranging direction. The second fin group includes plural second fins, and the second fins are arranged along a second arranging direction. The first arranging direction is different from the second arranging direction.

In an embodiment, the first fin group is made of a first fin material, and the second fin group is made of a second fin material. A first thermal conductivity coefficient of the first fin material is smaller than a second thermal conductivity coefficient of the second fin material.

In an embodiment, the second fin group includes plural second fins, and the plural second fins are arranged along a second arranging direction. The heat dissipation device further includes a covering member that covers the second fin group. The covering member includes two close-type sidewalls. The two close-type sidewalls are arranged along the second arranging direction.

In an embodiment, the heat dissipation device further includes a third fin group, and the heat pipe further includes a third pipe part. The third pipe part is connected with a second side of the first pipe part and bent and extended upwardly. The third pipe part is penetrated through the third fin group. The second fin group is arranged between the first fin group and the third fin group.

In an embodiment, the maximum vertical distance between a top surface of the third fin group and the base is larger than the maximum vertical distance between the top surface of the second fin group and the base.

In an embodiment, the maximum vertical distance between a bottom surface of the third fin group and the base is larger than the maximum vertical distance between a bottom surface of the second fin group and the base.

In an embodiment, the third fin group includes plural third fins, and the third fins are arranged along a third arranging direction. The second fin group includes plural second fins, and the second fins are arranged along a second arranging direction. The third arranging direction is different from the second arranging direction.

In an embodiment, the third fin group is made of a third fin material, and the second fin group is made of a second fin material. A third thermal conductivity coefficient of the third fin material is smaller than a second thermal conductivity coefficient of the second fin material.

From the above descriptions, the present invention provides a heat dissipation device. The maximum vertical distances between the top/bottom surfaces of different fin groups and the base are different. This design can achieve sufficient heat dissipating area and reduce the wind resistance. Regardless of whether the electronic device or system is equipped with the fan and regardless of whether the fan is far from or near the heat dissipation device, the influences of the dissipating area and the wind resistance are taken into consideration. Consequently, the heat dissipating efficacy of the heat dissipation device is enhanced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
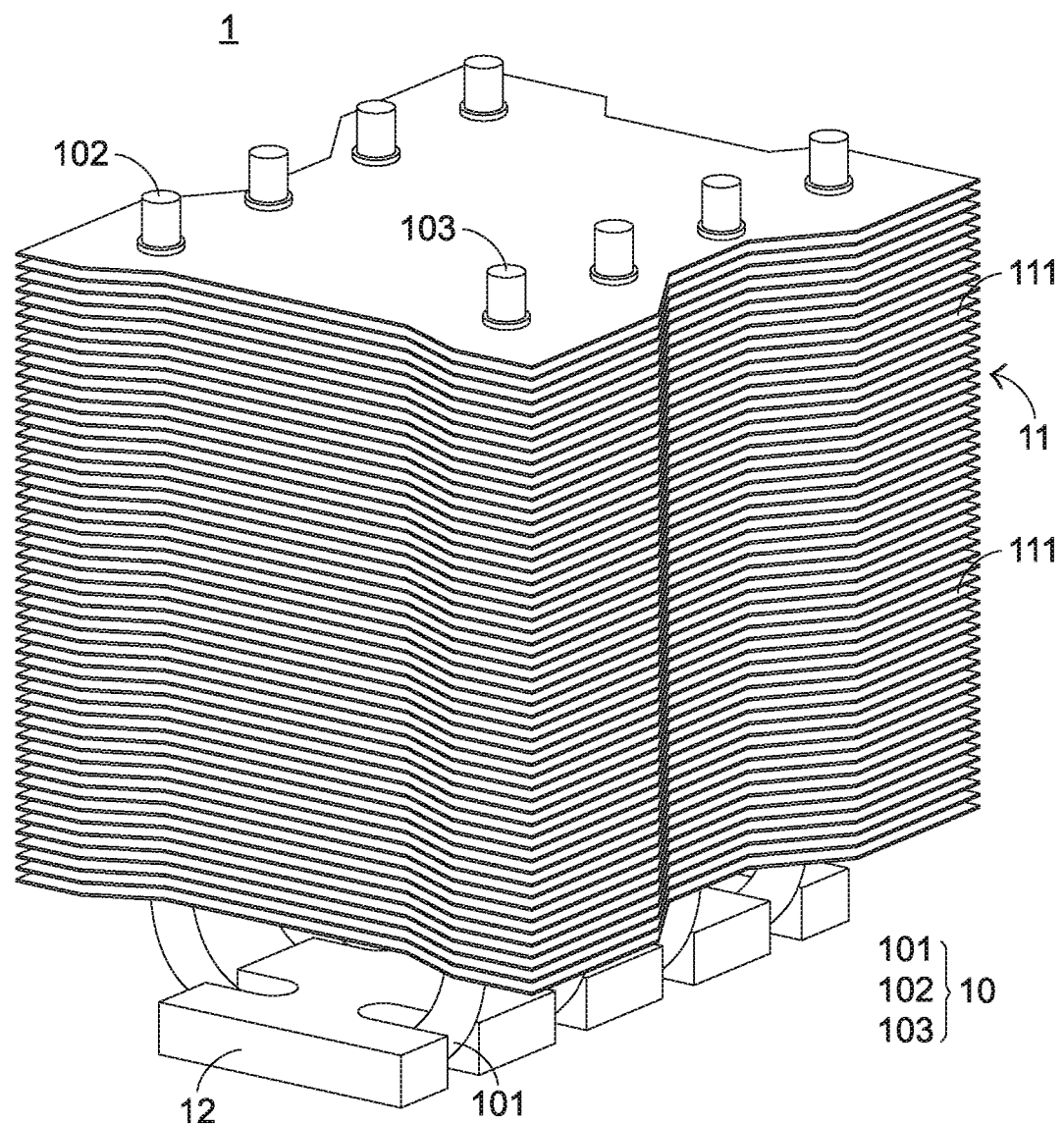
FIG. 1 is a schematic perspective view illustrating a conventional heat dissipation device.
Figure 2:
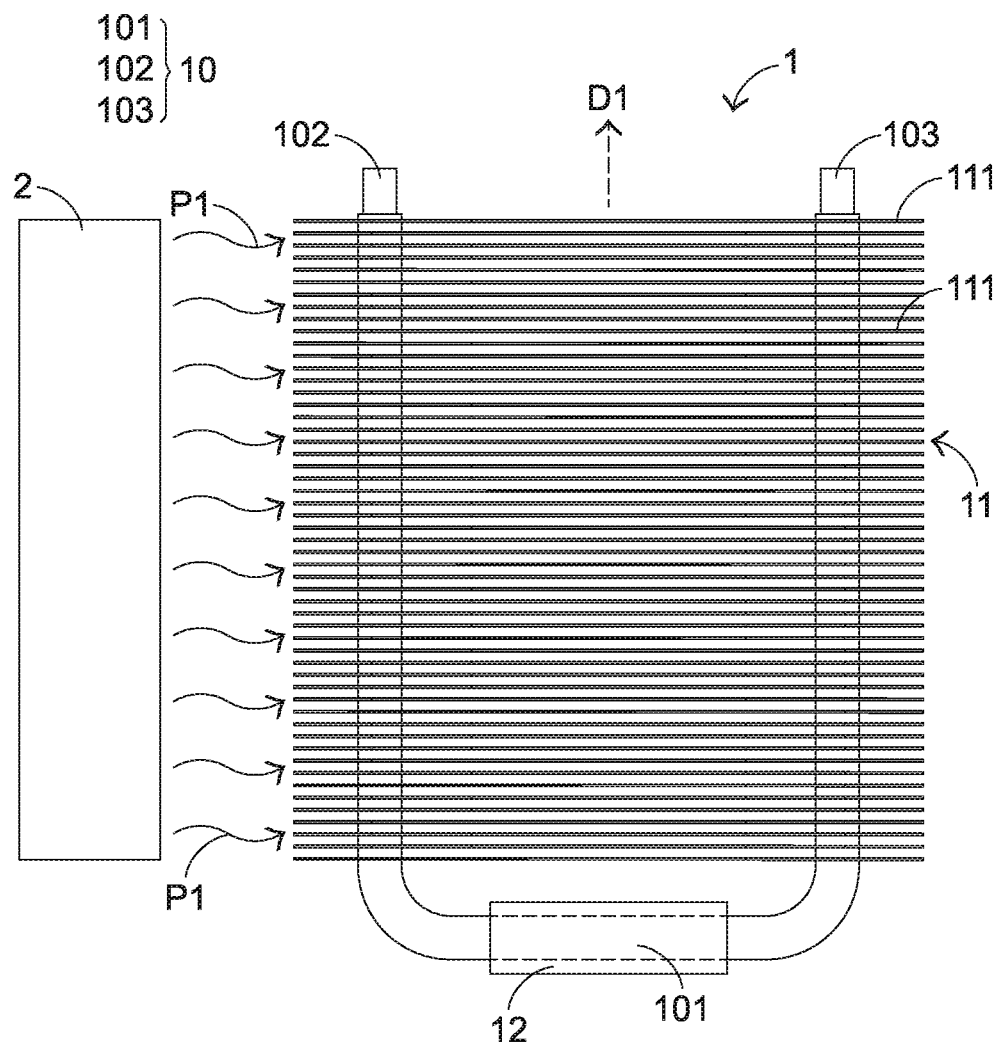
FIG. 2 is a schematic side view illustrating the cooperation of the heat dissipation device of FIG. 1 and a fan.
Figure 3:
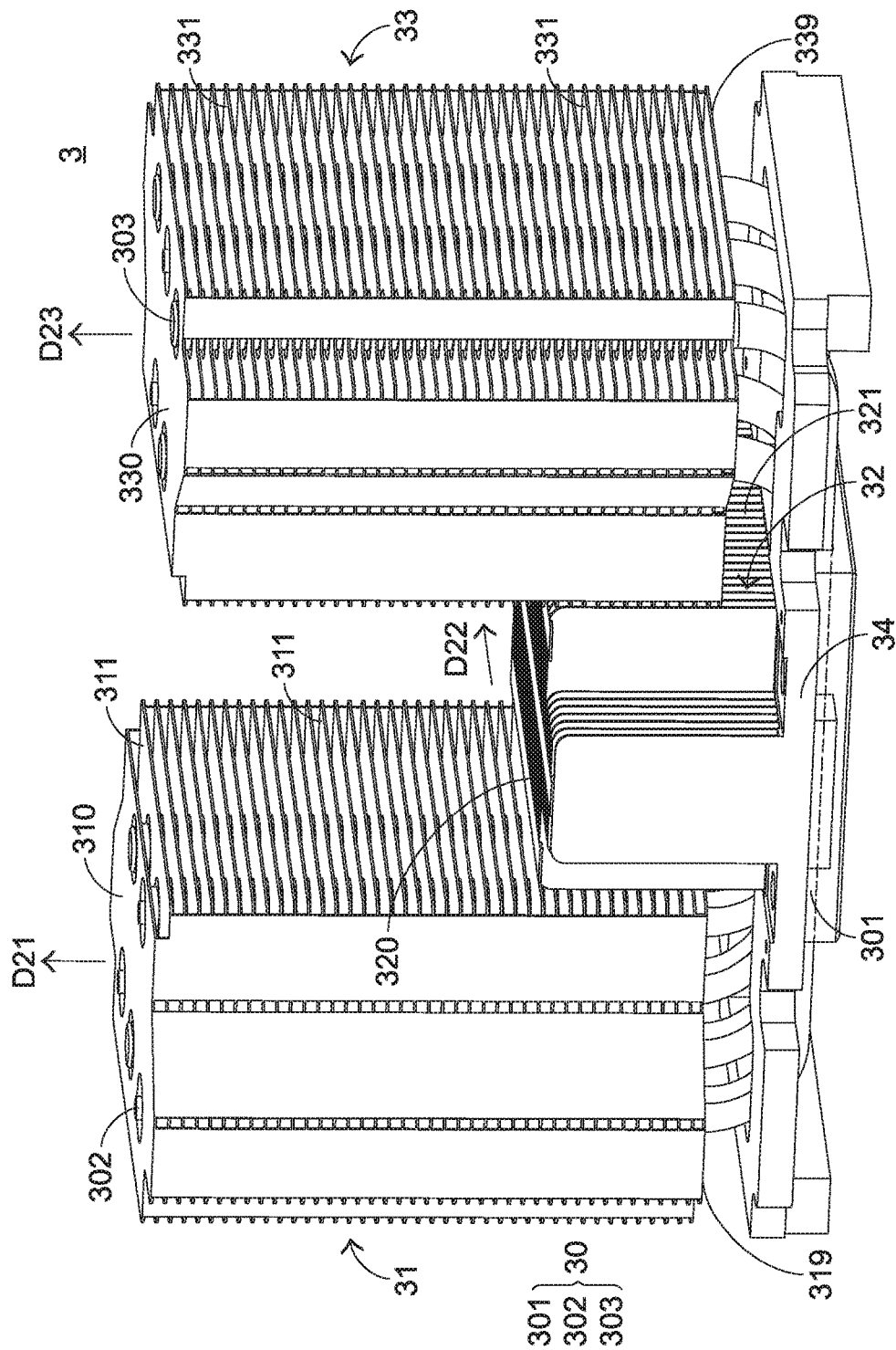
FIG. 3 is a schematic perspective view illustrating a heat dissipation device according to a first embodiment of the present invention.
Figure 4:
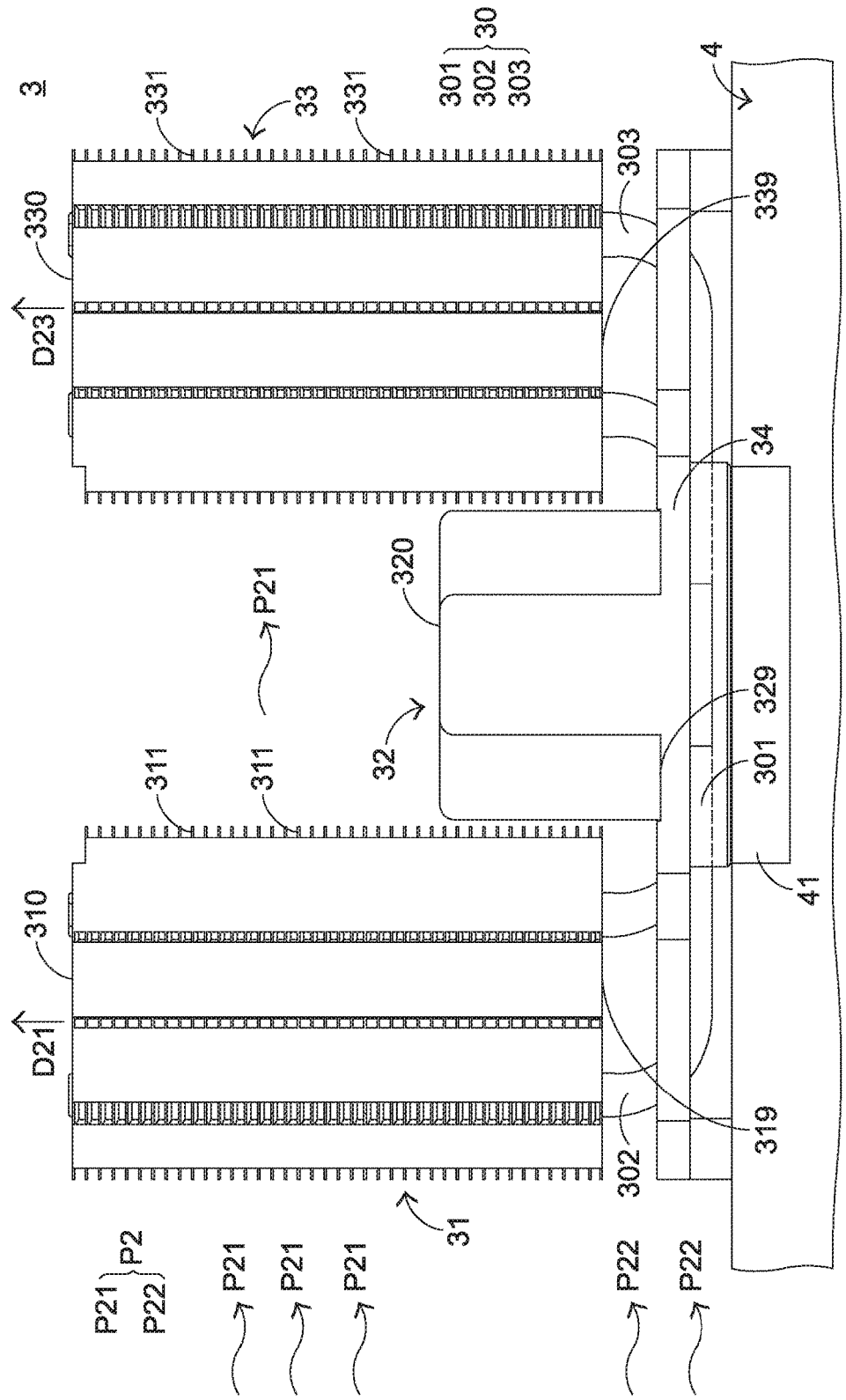
FIG. 4 is a schematic side view illustrating the heat dissipation device according to the first embodiment of the present invention.

FIG. 3 is a schematic perspective view illustrating a heat dissipation device according to a first embodiment of the present invention. FIG. 4 is a schematic side view illustrating the heat dissipation device according to the first embodiment of the present invention. For succinctness, only some components of the heat dissipation device are shown in FIG. 4. The heat dissipation device 3 comprises plural heat pipes 30, a first fin group 31, a second fin group 32, a third fin group 33 and a base 34. The base 34 is in thermal contact with a heat source 41. The heat source 41 is a heat generation component of any electronic device or system 4, for example a heat generation component of a cloud service system.

Each heat pipe 30 comprises a first pipe part 301, a second pipe part 302 and a third pipe part 303. The second pipe part 302 is connected with a first side of the first pipe part 301 and bent and extended upwardly. The third pipe part 303 is connected with a second side of the first pipe part 301 and bent and extended upwardly. The first pipe part 301 of each heat pipe 30 is in thermal contact with the base 34. For example, the first pipe part 301 of each heat pipe 30 is installed in a recess (not shown) of the base 34. Moreover, the first pipe part 301 of each heat pipe 30 is located under the second fin group 32 and in thermal contact with the second fin group 32. The second pipe part 302 of each heat pipe 30 is penetrated upwardly through the first fin group 31. The third pipe part 303 of each heat pipe 30 is penetrated upwardly through the third fin group 33.

In this context, the thermal contact is the contact via thermal conduction. In accordance with the present invention, the thermal contact has two types, including a direct contact mechanism and an indirect contact mechanism. In some embodiments, the thermal contact also includes the contact between two components that are close to each other but not contacted with each other. If two components are directly attached on each other, these two components are in direct contact. For example, the first pipe part 301 of the heat pipe 30 and the base 34 are directly attached on each other, the second fin group 32 and the first pipe part 301 of each heat pipe 30 are directly attached on each other, or the base 34 and the heat source 41 are directly attached on each other. If a thermally conductive medium (e.g., thermal paste) is arranged between two components, these two components are in indirect contact. The examples are presented herein for purpose of illustration and description only.

The first fin group 31 comprises plural first fins 311. The plural first fins 111 are arranged side by side and nearly parallel with each other along a first arranging direction D21. The second group 32 comprises plural second fins 321. The plural second fins 321 are arranged side by side and nearly parallel with each other along a second arranging direction D22. The third group 33 comprises plural third fins 331. The plural third fins 331 are arranged side by side and nearly parallel with each other along a third arranging direction D23. The first arranging direction D21 and the third arranging direction D23 are identical. The second arranging direction D22 is different from the first arranging direction D21 and the third arranging direction D23. In this embodiment, the first arranging direction D21 and the third arranging direction D23 are perpendicular to the base 34, and the second arranging direction D22 is parallel with the base 34.

The heat dissipation device 3 has the following features. Firstly, the maximum vertical distance between a top surface 310 of the first fin group 31 (i.e., a top surface of the topmost first fin 311 as shown in FIGS. 3 and 4) and the base 34 is larger than the maximum vertical distance between a top surface 320 of the second fin group 32 (i.e., a top plane defined by the top edges of the plural second fins 321 as shown in FIGS. 3 and 4) and the base 34. Similarly, the maximum vertical distance between a top surface 310 of the first fin group 31 (i.e., a top surface of the topmost first fin 311 as shown in FIGS. 3 and 4) and the base 34 is larger than the maximum vertical distance between a top surface 330 of the third fin group 33 (i.e., a top plane defined by the top edges of the plural third fins 331 as shown in FIGS. 3 and 4) and the base 34.

Secondly, the maximum vertical distance between a bottom surface 319 of the first fin group 31 (i.e., a bottom surface of the bottommost first fin 311 as shown in FIGS. 3 and 4) and the base 34 is larger than the maximum vertical distance between a bottom surface 329 of the second fin group 32 (i.e., a bottom plane defined by the bottom edges of the plural second fins 321 as shown in FIGS. 3 and 4) and the base 34. Similarly, the maximum vertical distance between a bottom surface 339 of the third fin group 33 (i.e., a bottom surface of the bottommost third fin 331 as shown in FIGS. 3 and 4) and the base 34 is larger than the maximum vertical distance between the bottom surface 329 of the second fin group 32 and the base 34.

The operations of the heat dissipation device 3 will be described as follows. Firstly, the heat generated by the heat source 41 is transferred to the base 34 that is in contact with the heat source 41. After the heat received by the first pipe part 301 of the each heat pipe 30, the heat is transferred along the following paths. A first portion of the heat is transferred upwardly to the second fin group 32 that is in contact with the first pipe part 301 of the each heat pipe 30. A second portion of the heat is laterally transferred to the second pipe part 302 of each heat pipe 30. A third portion of the heat is transferred to the third pipe part 303 of each pipe 30. Consequently, the second portion of the heat is transferred to the first fin group 31, and the third portion of the heat is transferred to the third fin group 33. The operating principles of the heat pipe 30 are well known to those in the art, and are not redundantly described herein.

As shown in the drawings, the airflow P2 blows in the direction to the third fin group 33 along the first fin group 31. The airflow P2 includes the upper-portion airflow P21 and the lower-portion airflow P22. The upper-portion airflow P21 passes through the first fin group 31 and the third fin group 33 sequentially. Consequently, the heat accumulated at (and near) the first fin group 31 and the third fin group 33 is dissipated away by the upper-portion airflow P21. Since the upper-portion airflow P21 passing through the first fin group 31 is not obstructed by the second fin group 32, the upper-portion airflow P21 blows to the third fin group 33 under a low wind resistance condition. On the other hand, the lower-portion airflow P22 is not obstructed by the first fin group 31. Since the lower-portion airflow P22 blows to the second fin group 32 under the low wind resistance condition, the heat accumulated at (and near) the second fin group 32 is dissipated away. Moreover, since the lower-portion airflow P22 passing through the second fin group 32 is not obstructed by the third fin group 33, the lower-portion airflow P22 blows out of the heat dissipation device 3 quickly under the low wind resistance condition.

In an embodiment, the first fin group 31, the second fin group 32 and the third fin group 33 are made of a first fin material, a second fin material and a third fin material, respectively. Preferably but not exclusively, the thermal conductivity coefficient of the second fin material is larger than the thermal conductivity coefficient of the first fin material and the thermal conductivity coefficient of the third fin material. For example, the second fin material is copper, and both of the first fin material and the second fin material are made of aluminum. Since the second fin group 32 is the closest to the heat source 32 and has the better thermal conduction efficacy, the overall heat dissipating performance of the heat dissipation device 3 is enhanced.

It is noted that numerous modifications and alterations may be made while retaining the teachings of the invention. Some variant examples of the heat dissipation device 3 will be illustrated as follows.

Figure 5:
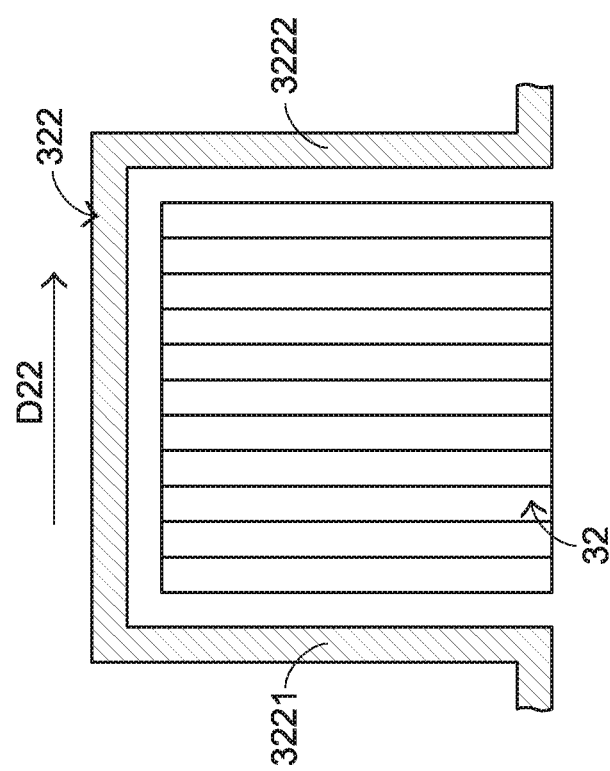
FIG. 5 schematically illustrates a second fin group and a covering member of a heat dissipation device according to a second embodiment of the present invention.

FIG. 5 schematically illustrates a second fin group and a covering member of a heat dissipation device according to a second embodiment of the present invention. For succinctness, only a second fin group 32 and a covering member 322 are shown in FIG. 5. Except for the following aspects, the structures of the heat dissipation device of this embodiment are substantially identical to those of the first embodiment. In comparison with the first embodiment, the heat dissipation device of this embodiment further comprises the covering member 322 for covering the second fin group 32. The covering member 322 comprises two close-type sidewalls 3221 and 3222, which are arranged along the second arranging direction D22. Consequently, while the airflow P reaches the second fin group 32 (see FIG. 4), the airflow P can pass through the second fin group 32 in the direction toward the third fin group 33 (see FIGS. 3 and 4) more centrally.

Figure 6:
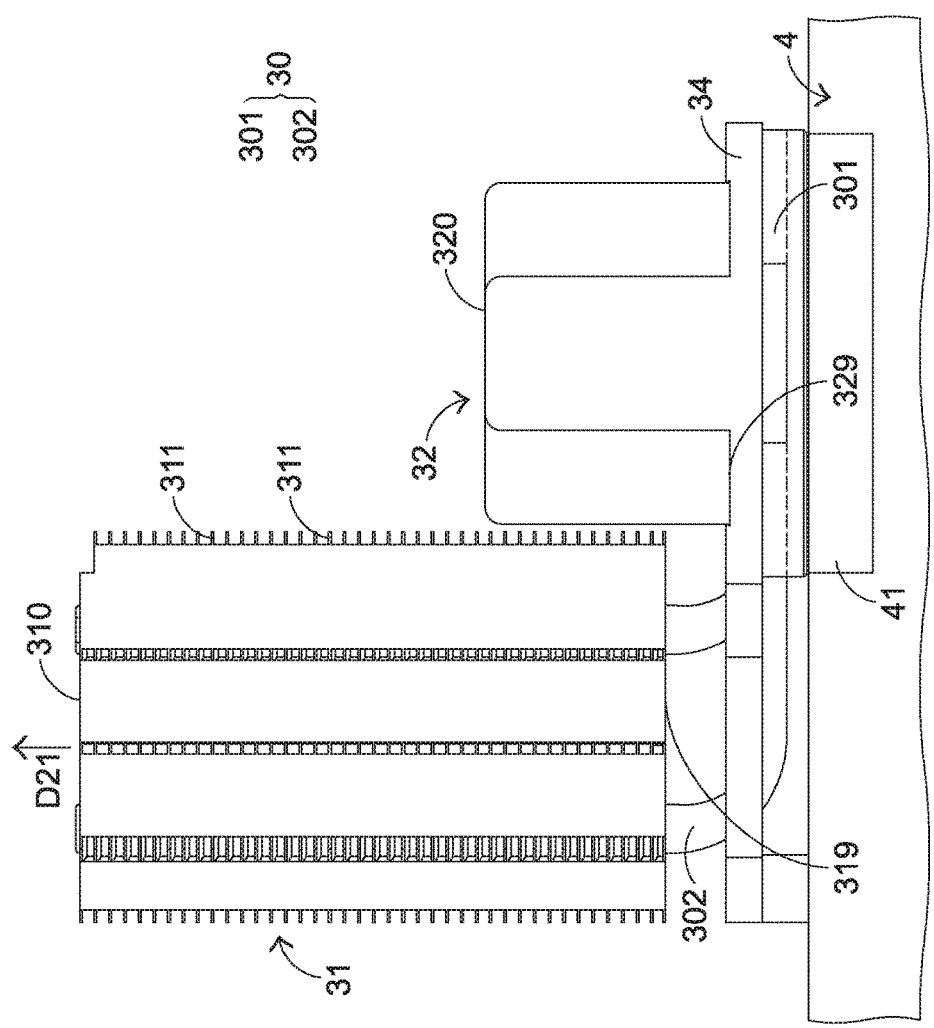
FIG. 6 is a schematic side view illustrating a heat dissipation device according to a third embodiment of the present invention.

FIG. 6 is a schematic side view illustrating a heat dissipation device according to a third embodiment of the present invention. Except for the following aspects, the structures of the heat dissipation device of this embodiment are substantially identical to those of the first embodiment. In comparison with the first embodiment, the heat dissipation device of this embodiment is not equipped with the third fin group 33 and the heat pipe 30 is not equipped with the third pipe part 303 when the available space or other factor is taken into consideration.

Figure 7:
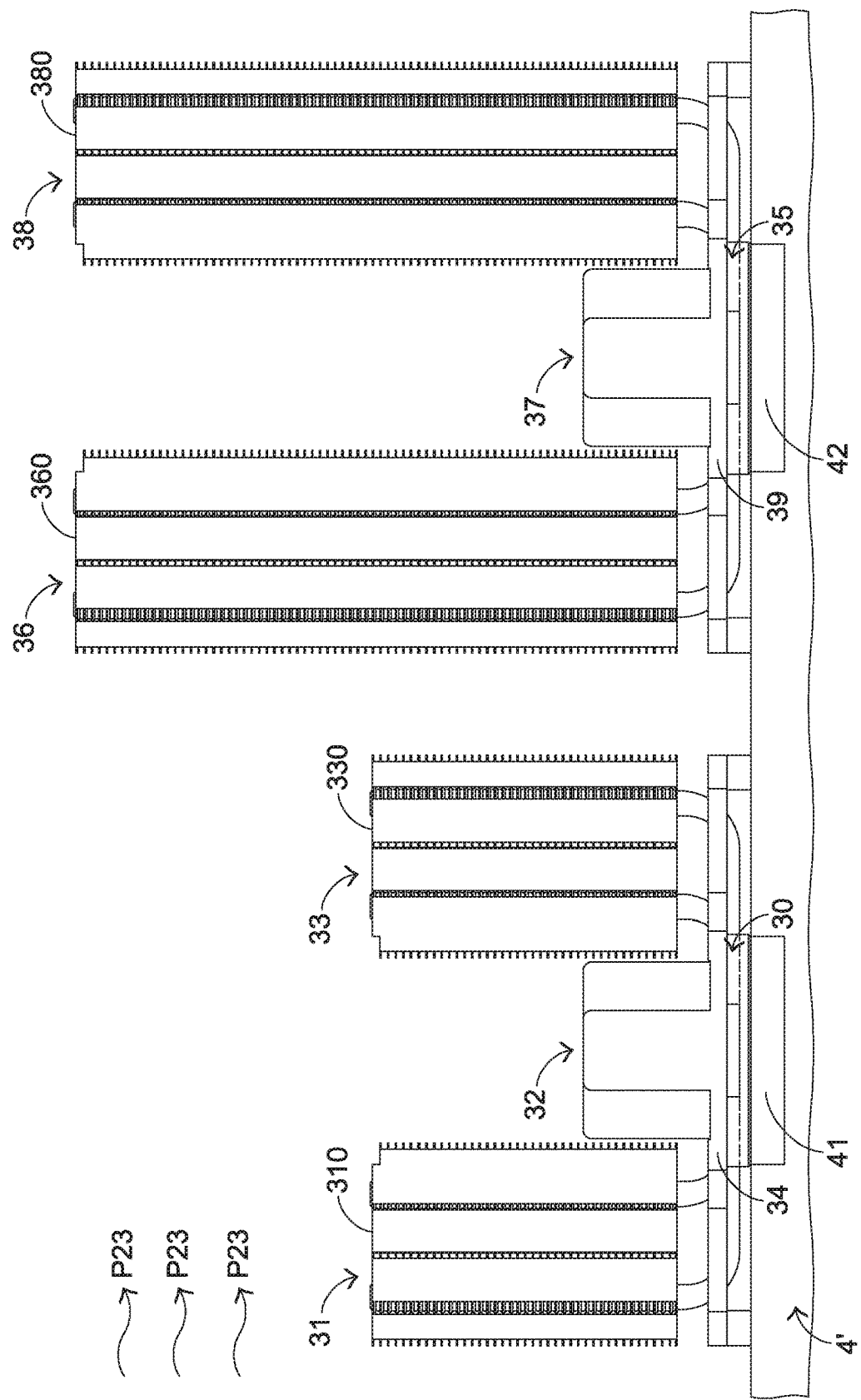
FIG. 7 is a schematic side view illustrating a heat dissipation device according to a fourth embodiment of the present invention.

FIG. 7 is a schematic side view illustrating a heat dissipation device according to a fourth embodiment of the present invention. Except for the following aspects, the structures of the heat dissipation device of this embodiment are substantially identical to those of the first embodiment. In comparison with the first embodiment, the heat dissipation device of this embodiment is applied to the electronic device or system 4' with two heat sources 41, 42 or more than two heat sources. Moreover, the heat dissipation device of this embodiment further comprises plural heat pipes 35, a fourth fin group 36, a fifth fin group 37, a sixth fin group 38 and an additional base 39.

The base 34 is in thermal contact with the heat source 41. The additional base 339 is in thermal contact with the heat source 42. The structure relationship and the position relationship between the plural heat pipes 35, the fourth fin group 36, the fifth fin group 37, the sixth fin group 38 and the additional base 39 are similar to those between the plural heat pipes 30, the first fin group 31, the second fin group 32, the third fin group 33 and the base 34. Consequently, the heat generated by the heat source is transferred to the fourth fin group 36, the fifth fin group 37 and the sixth fin group 38.

In this embodiment, a top surface 360 of the fourth fin group 36 and a top surface 380 of the sixth fin group 38 are higher than the top surface 301 of the first fin group 31 and the top surface 330 of the third fin group 33. When the airflow P23 passes through the heat dissipation device 3 in the direction from the first fin group 31 to the sixth fin group 38, the airflow P23 can reach the fourth fin group 36 and the sixth fin group 38 under the low wind resistance condition. After the airflow P23 passes through the fourth fin group 36 and the sixth fin group 38, the heat accumulated at (and near) fourth fin group 36 and the sixth fin group 38 is dissipated away by the upper-portion airflow P23.

Figure 8:
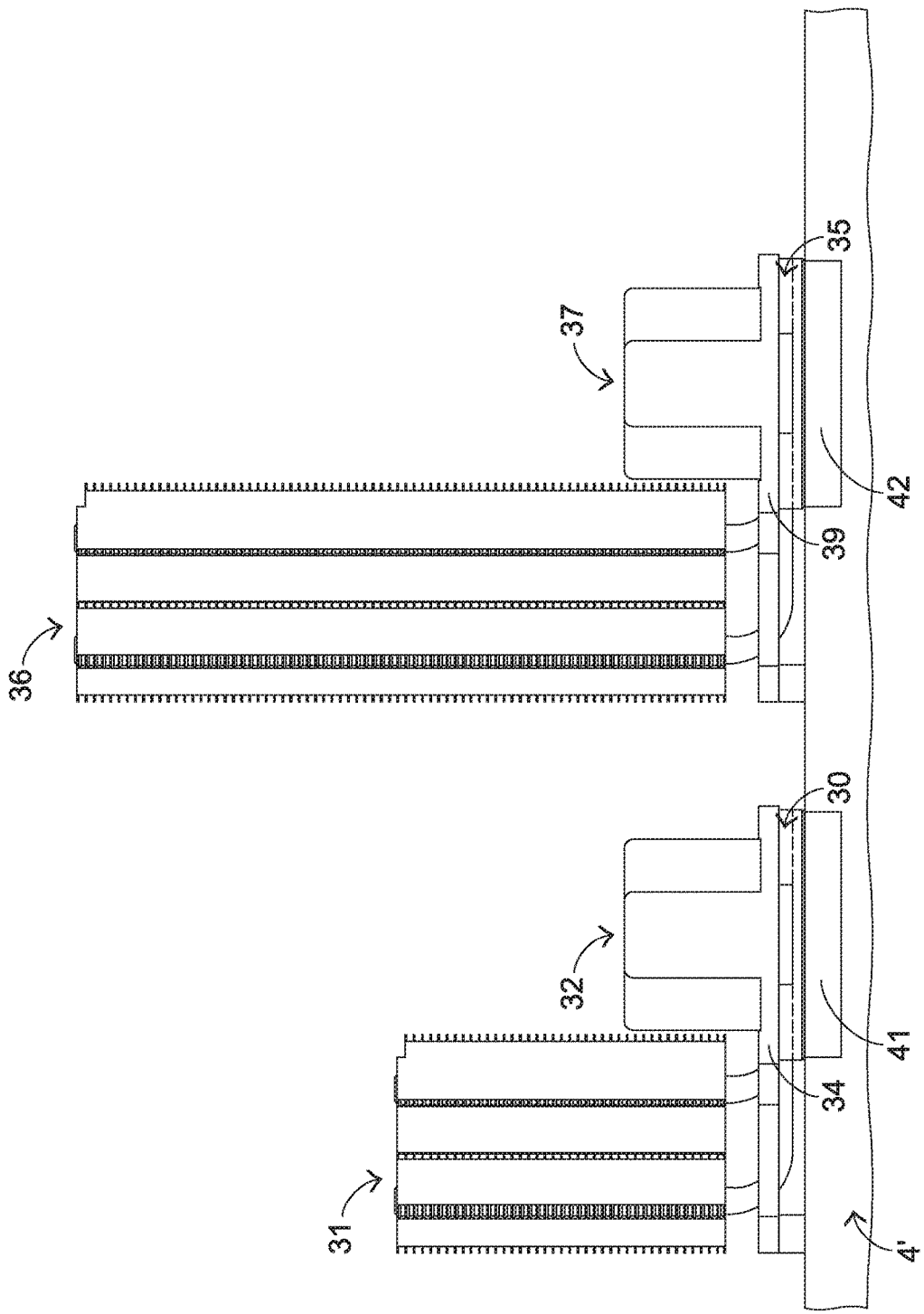
FIG. 8 is a schematic side view illustrating a heat dissipation device according to a fifth embodiment of the present invention.

FIG. 8 is a schematic side view illustrating a heat dissipation device according to a fifth embodiment of the present invention. Except for the following aspects, the structures of the heat dissipation device of this embodiment are substantially identical to those of the first embodiment. In comparison with the fourth embodiment, the heat dissipation device of this embodiment is not equipped with the third fin group 33 and the sixth fin group 38 when the available space or other factor is taken into consideration. Under this circumstance, the heat pipes 30 and 35 are not equipped with the pipe parts that are extended upwardly and penetrated through the third fin group 33 and the sixth fin group 38.

From the above descriptions, the present invention provides a heat dissipation device. Regardless of whether the electronic device or system is equipped with the fan and regardless of whether the fan is far from or near the heat dissipation device, the influences of the dissipating area and the wind resistance are taken into consideration. Consequently, the heat dissipation device has enhanced heat dissipating efficacy and is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A heat dissipation device, comprising:
a first fin group;
a base in contact with a heat source;
a heat pipe comprising a first pipe part and a second pipe part, wherein the second pipe part is connected with a first side of the first pipe part and bent and extended upwardly, the first pipe part is installed on the base, and the second pipe part is penetrated through the first fin group; and
a second fin group laterally adjacent to the first fin group, wherein the second fin group has an exposed top surface lower than a top surface of the first fin group and higher than a bottom surface of the first fin group, and the bottom surface of the first fin group is lower than the exposed top surface of the second fin group and higher than a bottom surface of the second fin group.

2. The heat dissipation device according to claim 1, wherein the maximum vertical distance between the bottom surface of the first fin group and the base is larger than the maximum vertical distance between the bottom surface of the second fin group and the base.

3. The heat dissipation device according to claim 1, wherein the first fin group comprises plural first fins, and the plural first fins are arranged along a first arranging direction, wherein the second fin group comprises plural second fins, and the second fins are arranged along a second arranging direction, wherein the first arranging direction is different from the second arranging direction.

4. The heat dissipation device according to claim 1, wherein the first fin group is made of a first fin material, and the second fin group is made of a second fin material, wherein a first thermal conductivity coefficient of the first fin material is smaller than a second thermal conductivity coefficient of the second fin material.

5. The heat dissipation device according to claim 1, wherein the second fin group comprises plural second fins, and the plural second fins are arranged along a second arranging direction, wherein the heat dissipation device further comprises a covering member that covers the second fin group, the covering member comprises two close-type sidewalls, and the two close-type sidewalls are arranged along the second arranging direction.

6. The heat dissipation device according to claim 1, wherein the heat dissipation device further comprises a third fin group, and the heat pipe further comprises a third pipe part, wherein the third pipe part is connected with a second side of the first pipe part and bent and extended upwardly, the third pipe part is penetrated through the third fin group, and the second fin group is arranged between the first fin group and the third fin group.

7. The heat dissipation device according to claim 6, wherein the maximum vertical distance between a top surface of the third fin group and the base is larger than the maximum vertical distance between the exposed top surface of the second fin group and the base.

8. The heat dissipation device according to claim 6, wherein the maximum vertical distance between a bottom surface of the third fin group and the base is larger than the maximum vertical distance between a the bottom surface of the second fin group and the base.

9. The heat dissipation device according to claim 6, wherein the third fin group comprises plural third fins, and the third fins are arranged along a third arranging direction, wherein the second fin group comprises plural second fins, and the second fins are arranged along a second arranging direction, wherein the third arranging direction is different from the second arranging direction.

10. The heat dissipation device according to claim 6, wherein the third fin group is made of a third fin material, and the second fin group is made of a second fin material, wherein a third thermal conductivity coefficient of the third fin material is smaller than a second thermal conductivity coefficient of the second fin material.

11. The heat dissipation device according to claim 3, wherein a thickness surface of one of the plural first fins faces thickness surfaces of the plural second fins.

12. The heat dissipation device according to claim 3, wherein one of the plural second fins has a width less than a width of another one of the plural second fins.

13. The heat dissipation device according to claim 9, wherein a thickness surface of one of the plural third fins faces thickness surfaces of the plural second fins.

* * * * *